United States Patent
Adam et al.

(10) Patent No.: US 7,525,062 B2
(45) Date of Patent: Apr. 28, 2009

(54) CAPACITIVE PROXIMITY AND/OR CONTACT SENSOR AND ELECTRICALLY CONDUCTIVE PLASTIC BODY FOR SUCH A SENSOR

(75) Inventors: Paul Adam, Sinzing (DE); Erwin Grauvogl, Sinzing (DE); Ralf Puchta, Regensburg (DE); Walter Sams, Lappersdorf (DE)

(73) Assignee: BSH Bosch und Siemens Hausgeraete GmbH, Munich (DE)

(*) Notice: Subject to any disclaimer, the term of this patent is extended or adjusted under 35 U.S.C. 154(b) by 891 days.

(21) Appl. No.: 11/119,257

(22) Filed: Apr. 29, 2005

(65) Prior Publication Data

US 2005/0248544 A1 Nov. 10, 2005

Related U.S. Application Data

(63) Continuation of application No. PCT/EP03/11714, filed on Oct. 22, 2003.

(30) Foreign Application Priority Data

Oct. 29, 2002 (DE) ................ 102 50 395

(51) Int. Cl.
  *H03K 17/975* (2006.01)
(52) U.S. Cl. ................ 200/600; 200/511
(58) Field of Classification Search ........... 200/600, 200/61.41, 61.43, 511, 512, 85 R, 85 A, 86 R; 341/20, 22, 33, 34; 345/156, 168, 169, 173, 345/174; 73/514.32; 338/99, 114, 160
See application file for complete search history.

(56) References Cited

U.S. PATENT DOCUMENTS

| | | | |
|---|---|---|---|
| 3,509,296 A * | 4/1970 | Lewis et al. ........... | 200/46 |
| 4,380,007 A | 4/1983 | Steinegger | |
| 5,087,825 A | 2/1992 | Ingraham | |
| 5,917,165 A * | 6/1999 | Platt et al. ............ | 200/600 |
| 5,973,417 A | 10/1999 | Goetz et al. | |
| 6,265,682 B1 | 7/2001 | Lee | |
| 6,642,467 B2 * | 11/2003 | Farringdon ........... | 200/511 |

(Continued)

FOREIGN PATENT DOCUMENTS

DE  31 19 495 A1  2/1982

(Continued)

*Primary Examiner*—Michael A Friedhofer
(74) *Attorney, Agent, or Firm*—Laurence A. Greenberg; Werner H. Stemer; Ralph E. Locher

(57) ABSTRACT

A capacitive proximity and/or contact sensor has an electrically conductive plastic body, which is disposed between an electrically insulating cover plate and an electrically conductive contact surface of a carrier plate disposed at a distance therefrom. The contact surface can be connected to a gating circuit, through which a change in a capacitance of a condenser formed by the cover plate, the plastic body and the contact surface as a result of proximity and/or contact of a contact region of the cover plate by an element, having a potential different to the potential of the contact surface, can be ascertained and evaluated. The plastic body is configured as a plug-in and/or clamp part and by plugging-in or clipping on the or by clamping on the carrier plate is connected form lockingly and/or force lockingly to the latter and thus to the contact surface.

11 Claims, 3 Drawing Sheets

U.S. PATENT DOCUMENTS

| | | | |
|---|---|---|---|
| 6,667,563 B2 * | 12/2003 | Bae et al. | 307/112 |
| 6,723,933 B2 * | 4/2004 | Haag et al. | 200/61.42 |
| 6,723,937 B2 * | 4/2004 | Englemann et al. | 200/600 |
| 6,770,824 B1 * | 8/2004 | Faucher | 200/5 A |
| 7,210,939 B2 * | 5/2007 | Marmaropoulos et al. | 439/37 |
| 7,232,973 B2 * | 6/2007 | Kaps et al. | 200/600 |
| 7,342,190 B2 * | 3/2008 | Burgess et al. | 200/61.43 |

FOREIGN PATENT DOCUMENTS

| | | |
|---|---|---|
| DE | 35 19 495 A1 | 12/1986 |
| EP | 0 859 467 A1 | 8/1998 |
| EP | 1 018 787 A1 | 7/2000 |
| EP | 1 061 608 A2 | 12/2000 |

* cited by examiner

CAPACITIVE PROXIMITY AND/OR CONTACT SENSOR AND ELECTRICALLY CONDUCTIVE PLASTIC BODY FOR SUCH A SENSOR

CROSS-REFERENCE TO RELATED APPLICATION

This is a continuing application, under 35 U.S.C. § 120, of copending international application No. PCT/EP2003/011714, filed Oct. 22, 2003, which designated the United States; this application also claims the priority, under 35 U.S.C. § 119, of German patent application No. 102 50 395.8, filed Oct. 29, 2002; the prior applications are herewith incorporated by reference in their entirety.

BACKGROUND OF THE INVENTION

Field of the Invention

The invention relates to a capacitive proximity and/or contact sensor with an electrically conductive plastic body. The body is disposed between an underside region of an electrically insulating cover plate and an electrically conductive contact surface of a carrier plate disposed at a distance from the latter. The carrier plate is fixed in its position relative to the aforementioned cover plate and its contact surface can be connected to a gating circuit, through which a change in a capacitance of a condenser formed by the cover plate, the plastic body and the aforementioned contact surface can be ascertained and evaluated. The capacitance changes as a result of proximity and/or contact of an upper side of the cover plate opposite the aforementioned underside region via an element, which carries a potential different to the potential of the contact surface, in particular an earth potential.

The invention additionally relates to an electrically conductive plastic body for a capacitive proximity and/or contact sensor.

A capacitive sensor of the type initially described in the form of a proximity switch has been known for some time (see published, non-prosecuted German patent application DE 31 19 495 A1). The relevant known proximity switch has a capacitive probe with a metallic support, which is connected to a gating circuit and a layer of conductive foam is disposed between the cover plate and a cover plate acting as dielectric made of an electrically insulating material, such as glass. The configuration is such that due to its elasticity the aforementioned foam layer adapts to the cover plate, without an air gap remaining in between. The foam layer between the cover plate and the metallic support is thus kept below a certain pressure. In the context in question though it is not known how the relevant foam layer between the above-mentioned carrier plate and the afore-mentioned cover plate can be kept stable in its position relative to the relevant plates both during installation and during operation.

There is also a capacitive keyboard layout known (see U.S. Pat. No. 5,087,825), which contains a substrate having a plurality of electrically conductive plate members connected thereto, insulated from one another. The relevant plate members are superposed by a substantially solid dielectric member, which has a side facing the plate members. Also, a plurality of electrically conductive transfer members is provided, whereof each contains a compressible conductive polymer and extends between the dielectric member and one of the aforementioned plate members, to produce an airtight contact face with the relevant dielectric member and with the associated plate member of the aforementioned plate members. Connected to the relevant plate members finally is a circuit array, corresponding to the capacitance between the relevant plate members and earth or respectively ground, to create a signal characterising for a change in capacitance between at least one of the relevant plate members and earth or respectively ground. With this known capacitive keyboard layout the same sensor principle is therefore applied, as is already utilised in the abovementioned known proximity switch. Instead of the electrically conductive foam layer used in the relevant known proximity switch, however, a compressible conductive polymer is used in the known capacitive keyboard layout. With respect to the transfer members containing a compressible conductive polymer it is known in the abovementioned context that the latter are embedded in between the dielectric member and the plate members. Such installation however as a rule ensures no long-term stable configuration of such transfer members. Depending on its application one has to consider a shift of the relevant transfer members and this results in a no longer satisfactory operating mode of the keyboard layout.

A contact switch with a sensor key is disclosed in European patent EP 0 859 467 B1 (corresponding to U.S. Pat. No. 5,917,165), which operates on the same principle as the aforementioned capacitive proximity switch. Instead of the electrically conductive foam layer used in the relevant known proximity switch here however a plastic body made of conductive plastic or a rubber material and if required silicon is used, and the respective fixed assembly of the relevant plastic body is ensured in that either the relevant plastic body is placed on the associated contact surface and/or the cover plate by a conductive adhesive or double adhesive band and/or is set on a fastening pin. However this requires that additional procedural steps have to be executed, and this is to be generally avoided at all costs.

SUMMARY OF THE INVENTION

It is accordingly an object of the invention to provide a capacitive proximity and/or contact sensor and an electrically conductive plastic body for such a sensor which overcomes the above-mentioned disadvantages of the prior art devices of this general type, in which a stable and secure fastening of the plastic body between the insulating cover plate and the associated contact surface can be made particularly easily in a relatively easily produced capacitive proximity and/or contact sensor of the aforementioned type.

With the foregoing and other objects in view there is provided, in accordance with the invention, a capacitive proximity and/or touch sensor. The sensor contains an electrically insulating cover plate having a lower-side region and a touch region opposite the lower-side region, a carrier plate having an electrically conducting contact area and disposed at a distance from the cover plate, and an electrically conductive plastic body disposed between the lower-side region of the cover plate and the contact area of the carrier plate. A position of the carrier plate is fixed in relation to the cover plate and it is possible to connect the contact area of the carrier plate to an evaluation circuit for detecting and evaluating a change in capacitance of a capacitor. The capacitor is formed by the cover plate, the plastic body and the contact area. The change in capacitance being caused by an element having a potential differing from a potential of the contact area, coming into proximity of and/or touching the touch region of the cover plate. The plastic body is a clamping part and is form lockingly connected to the carrier plate and thus to the contact area by clamping the carrier plate. The plastic body has at least one clamping slot formed therein for holding the carrier plate at the contact area.

The task is solved in a capacitive proximity and/or contact sensor of the aforementioned type according to the present invention by the plastic body being configured as a plug-in and/or clamp part and by plugging-in or clipping on or by clamping on the carrier plate with the latter and is thus connected to the contact surface form lockingly and/or force lockingly.

The advantage of the invention is that the plastic body is constantly fixed particularly easily in its position between the electrically insulating cover plate and the associated electrically conductive contact surface of the carrier plate, without separate work steps such as applying an adhesive or an adhesive band and/or a fastening pin being required. Only by plugging-in and clipping on or by clamping of the plastic body configured as a plug-in and/or clamp part onto the carrier plate with the associated contact surface and the thus connected form lockingly and/or force lockingly between the plastic body and the relevant contact surface or respectively the carrier plate exhibiting the latter is the desired fixed configuration of the plastic body between the aforementioned cover plate and the associated contact surface of the carrier plate constantly ensured. This effectively produces a capacitive proximity and/or contact sensor relatively easy to manufacture and secure with respect to its function.

The plastic body configured as a plug-in part preferably has on its plug-in end a peg-shaped plug-in mandrel, which is pressed in or thrust in to a correspondingly formed take-up opening of the contact surface and of the carrier plate, or it has in its outer side running in a plug-in direction at least one take-up slot extending in this plug-in direction, in which the carrier plate is received with the contact surface. This gives the advantage of particularly low constructive expenditure for the plastic body configured as a plug-in part.

The plastic body configured as a plug-in part effectively has configured in its outer side running in the plug-in direction two diametrically opposite take-up slots, in which the carrier plate is received with its contact surface. This advantageously ensures particularly good positioning of the plastic body configured as a plug-in part.

According to another effective further development of the invention the plastic body configured as a clamping part has at least one clamp slot, by which the carrier plate is taken up by its contact surface. The advantage here is that the plastic body is available particularly easily as a clamping part and can be held in a secure position on the contact surface of the carrier plate.

The plastic body has in a region between its bearing on the underside region of the cover plate and the contact surface of the carrier plate either a polygonal, in particular rectangular cross-section or a round cross-section. Such formed plastic bodies can be manufactured particularly easily.

Preferably the plastic body is formed by a stamped, injected, cast or extruded part. The advantage here is that the plastic body can be produced using simple manufacturing steps.

To increase the elasticity of the plastic body at least one cavity is formed in it. The relevant cavity can be made e.g. by at least one bore or respectively a hole or a slot. It is also of advantage to form the plastic body from electrically conductive silicon. It is thus particularly well suited to use in environments with higher temperatures, as occur in particular in electro-cooking units, in which capacitive proximity and/or contact sensors are employed for different setting and control procedures.

To construct a capacitive proximity and/or contact sensor according to the invention the present invention further provides a plastic body, which has a surface adapted to the relevant underside region bearing on an underside region of an electrically non-conductive cover plate and which is configured as a plug-in and/or a clamp part in its area to be connected to a contact surface of a carrier plate. The resulting advantage here is a particularly simple construction of the plastic body, which can be produced easily in addition.

Other features which are considered as characteristic for the invention are set forth in the appended claims.

Although the invention is illustrated and described herein as embodied in a capacitive proximity and/or contact sensor and an electrically conductive plastic body for such a sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
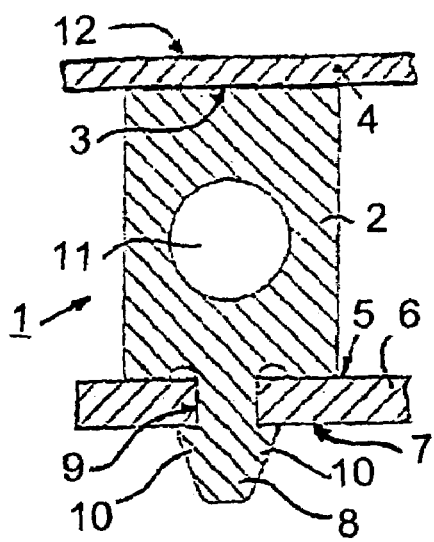
FIG. 1 is an enlarged, diagrammatic, sectional view of a capacitive proximity and/or contact sensor according to a first embodiment of the invention.

Before the figures of the drawing are examined in finer detail, it should be noted that corresponding or identical elements or respectively individual components are designated in all diagrams and figures by identical reference numerals in the various embodiments of a capacitive proximity and/or contact sensor 1 according to the invention.

Referring now to the figures of the drawing in detail and first, particularly, to FIG. 1 thereof, there is shown an enlarged sectional view of the capacitive proximity and/or contact sensor 1 according to a first embodiment of the present invention. The relevant proximity and/or contact sensor 1 contains an electrically conductive plastic body 2, which preferably is formed of an electrically conductive silicon. The plastic body 2 has in its upper region a smooth cover side, which lies close and under pressure to a smooth underside region 3 of an electrically insulating cover plate 4. Disposed at a distance from the cover plate 4 and running parallel thereto is a carrier plate 6 with an electrically conductive contact surface 5 facing the underside region 3. The cover plate 4 and the carrier plate 6 lie fixed in their relative position to one another. The carrier plate 6 can for example be a printed circuit board, which can likewise have a contact surface to the abovementioned contact surface 5 on its opposite plate side 7 and which can be provided single-sided or double-sided with strip conductors.

The cover plate 4 can for example be formed of glass or ceramic, and the carrier plate 6 can be a plastic plate, which has the abovementioned contact surface 5 and if required strip conductors on at least one of its plate sides. With respect to the contact surface or respectively contact surfaces it should again be mentioned here that a gating circuit can be connected to this or respectively these, the task of which will be explained in greater detail here in below.

The plastic body 2 shown in FIG. 1 has in its lower region a peg-shaped plug-in mandrel 8, which is pressed or thrust into a correspondingly formed take-up opening 9 of the contact surface 5 and thus the carrier plate 6 such that the relevant plastic body 2 is connected, between its underside lying on the contact surface 5 and the trunnions 10 of the plug-in mandrel 8 lying opposite the plate side 7 of the carrier plate 6, to the contact surface 5 and the plate side 7 and thus to the carrier plate 6 form lockingly and/or force lockingly. The plastic body 2 is configured according to FIG. 1 as a plug-in part or clamping part.

Figure 2:
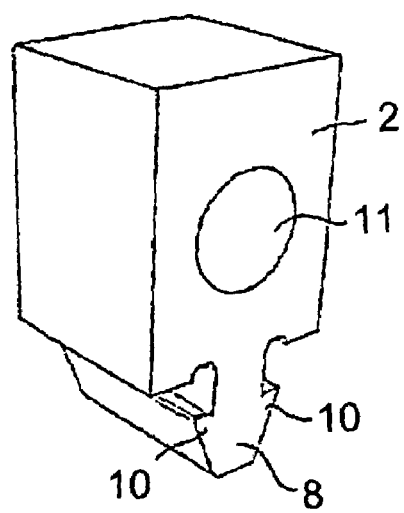
FIG. 2 is a perspective view of a plastic body configured as a plug-in part and contained in the capacitive proximity and/or contact sensor according to FIG. 1.

The abovementioned peg-shaped plug-in mandrel 8 of the plastic body 2 can either be a peg-shaped plug-in mandrel, or it can be a lengthy plug-in mandrel, as evident in the perspective view of the relevant plastic body 2 illustrated FIG. 2. With respect to the plastic body 2 shown in FIG. 1 and FIG. 2 it should be noted that this has a rectangular cross-section in the region between its bearing on its underside region 3 of the cover plate 4 and the contact surface 5 of the carrier plate, as evident in particular in FIG. 2. The relevant plastic body can however also have another polygonal cross-section or, as will be evident here in below, a round cross-section. Also, the relevant plastic body 2 has a round hole 11, through which the plastic body 2 is more elastic in its longitudinal direction than in the case where it has no opening or respectively cavity.

The result of the structure shown in FIG. 1 is thus a capacitive proximity and/or contact sensor, which works basically similarly to the initially explained known capacitive contact switch. If an element, such as for example a finger, which guides a potential different to the potential of the contact surface 5 of the carrier plate 6, in particular earth potential, is brought near the proximity or respectively contact region 12 opposite the aforementioned underside region 3 of the electrically insulating cover plate 4, and/or is placed in contact with the latter, a change in capacitance of a condenser formed of the relevant element or respectively the abovementioned finger, the aforementioned cover plate 4, the plastic body 2 and the aforementioned contact surface 5 is brought about, and the change in capacitance can be established and evaluated by the already abovementioned gating circuit connected to the relevant contact surface 5. The relevant change in capacitance is relatively large, since the plastic body with its face shown in FIG. 1 above lies fully flat on the underside region 3 of the electrically insulating cover plate 4 without an air gap and is connected form lockingly and/or force lockingly in the region of the contact surface 5 to the carrier plate 6 running parallel to the abovementioned cover plate. Full-surface support or respectively bearing of the plastic body 2 onto or respectively on the contact surface 5 and the contact surface if required provided on the carrier plate exterior 7 is not required to guarantee the desired function of the capacitive proximity and/or contact sensor 1.

Figure 3:
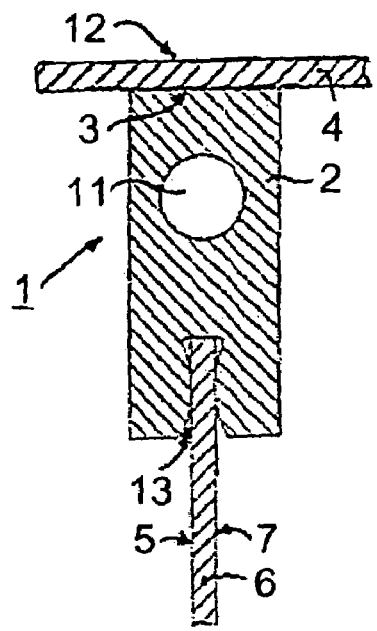
FIG. 3 is an enlarged, diagrammatic, sectional view of the capacitive proximity and/or contact sensor according to a second embodiment of the invention.

FIG. 3 illustrates an enlarged sectional view of a second embodiment of the capacitive proximity and/or contact sensor 1 according to the invention. The capacitive contact sensor 1 illustrated in FIG. 3 has a likewise plastic body configured as a plug-in part 2, which, like the plastic body according to FIGS. 1 and 2, has a hole 11, but also contains a take-up or respectively clamp slot 13 running in its plug-in direction, by which the carrier plate 6 is received with its contact surface 5 and the plate side 7 form lockingly and/or force lockingly, which likewise can have a contact surface. The plastic body 2 also preferably is formed of an electrically conductive silicon.

In comparison to the capacitive proximity and/or contact sensor 1 shown in FIG. 1 with the capacitive proximity and/or contact sensor 1 according to the invention shown in FIG. 3 the electrically insulating cover plate 4 with its underside region 3 and its proximity or respectively contact region 12 and the carrier plate 6 do not run parallel to one another, rather they stand at a right angle to one another; with respect to their relative position to one another the cover plate 4 and the carrier plate 6 however are also fixed in this case. In addition, the plastic body 2 is also fixed here with its upper side, that is, without an air gap, on the underside region 3 of the cover plate 4. When it comes to the functioning of the capacitive proximity and/or contact sensor 1, the same ratios apply as have been explained in connection with the capacitive proximity and/or contact sensor 1 shown in FIG. 1.

Figure 4:
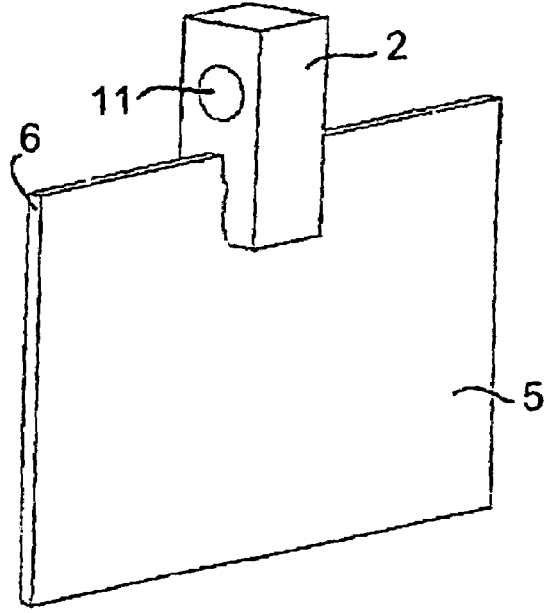
FIG. 4 is a perspective view of the plastic body configured as the plug-in part contained in the capacitive proximity and/or contact sensor according to FIG. 3.

FIG. 4 shows in a perspective view the plastic body configured as a plug-in part 2 shown in FIG. 3, as it is stuck on the carrier plate 6, whereof only the contact surface 5 is shown in FIG. 4. It may be evident that the carrier plate 6 basically ends up with only one contact surface 5 to produce an electrically conductive connection with the plastic body 2. It can however be appropriate likewise to provide an electrically conductive contact surface on the plate side 7 opposite the contact surface 5. This effectively increases the contact face between the take-up or respectively clamp slot 13 of the plastic body 2 and the contact surfaces.

Figure 5:
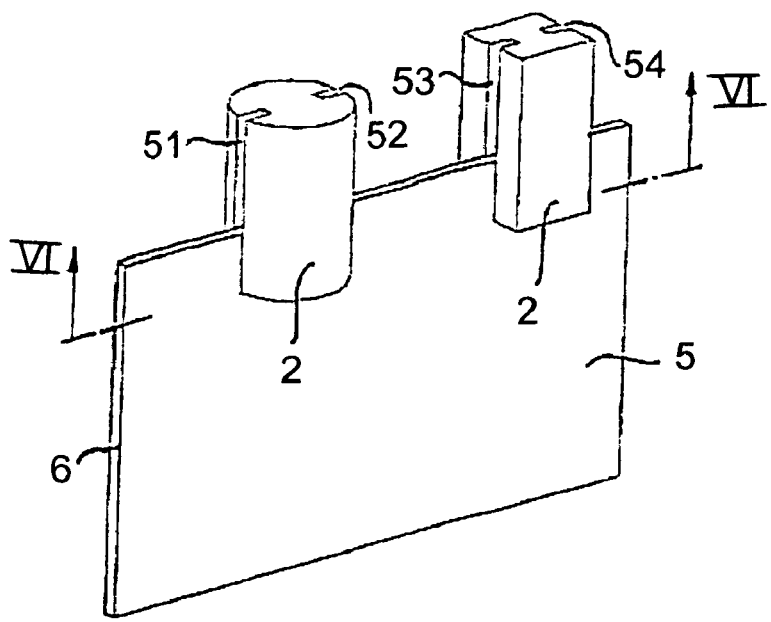
FIG. 5 is an enlarged perspective view of two other plastic bodies configured as plug-in parts on a carrier plate for the capacitive proximity and/or contact sensor according to a third embodiment of the invention.

FIG. 5 shows in a similar perspective view as FIG. 4 a further modification of the plastic body 2 used for a capacitive proximity and/or contact sensor according to a third embodiment of the invention, which likewise preferably is formed of an electrically conductive silicon. In contrast to the plastic body 2 shown in FIGS. 3 and 4 the two diametrically opposite take-up slots 51, 52 or respectively 53, 54 shown in FIG. 5, in each case exhibit a plastic body configured as the plug-in part 2 in its outer side running in the plug-in direction in each case, in which the carrier plate 6 is received by its contact surface 5.

Figure 6:
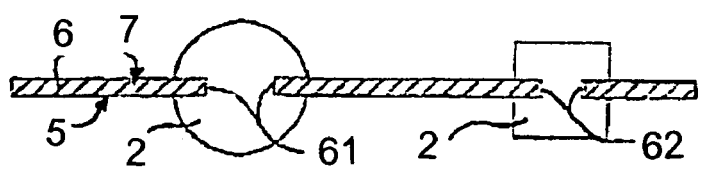
FIG. 6 is a diagrammatic, sectional view taken along the line VI-VI in shown in FIG. 5.

As evident from the sectional view shown in FIG. 6 taken along the line VI-VI shown in FIG. 5, both the electrically conductive plastic bodies 2 are taken up with their diametrically opposite take-up slots 51, 52 or respectively 53, 54 by correspondingly dimensioned slots 61 or respectively 62 of the carrier plate 6. In this context it should be noted that the carrier plate 6 can not only be configured on its outer side designated by 5 as a contact surface, but also the opposite other outer side 7 can likewise be configured as a contact surface.

Figure 7:
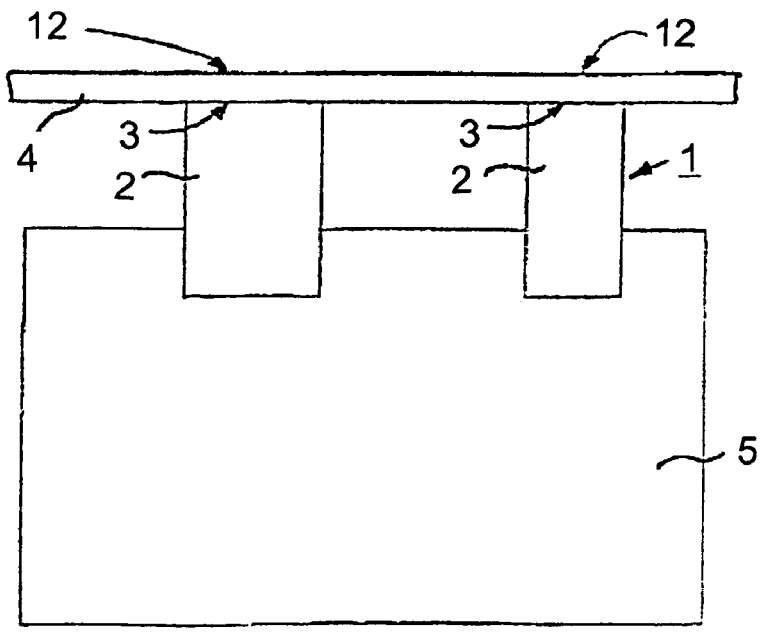
FIG. 7 is a diagrammatic, side elevational view of the capacitive proximity and/or contact sensor according to the third embodiment of the invention using the plastic body shown in FIG. 5.

FIG. 7 shows in a side elevation view the abovementioned third embodiment of the capacitive proximity and/or contact sensor 1 according to the invention with the configuration shown in FIG. 5 with both plastic bodies 2 taken up by the carrier plate 6 and the electrically insulating cover plate 4 at a distance from the carrier plate 6 lying on the plastic bodies 2 with its underside regions 3 and its proximity or respectively contact regions 12. With their upper sides the plastic bodies 2 rest flush against the underside regions 3 of the cover plate 4 that is, without air gaps. Here, too, the carrier plate 6 and the cover plate 4 are in a fixed relative position to one another. With respect to the function of the thus formed capacitive proximity and/or contact sensor 1 the same ratios are present, as explained in connection with the capacitive proximity and/or contact sensor 1 shown in FIG. 1.

Figure 8:
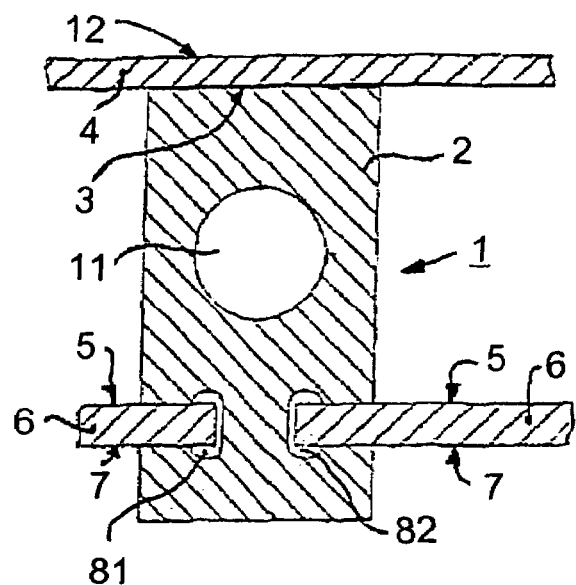
FIG. 8 is an enlarged, diagrammatic, sectional view of the capacitive proximity and/or contact sensor according to a fourth embodiment of the invention.

FIG. 8 illustrates in an enlarged side elevation the capacitive proximity and/or contact sensor 1 according to a fourth embodiment of the invention. In contrast to the abovementioned embodiments of the capacitive proximity and/or contact sensor according to the invention, FIG. 8 shows an electrically conductive plastic body 2 configured as a clamping part, having two clamp slots 81, 82, which are taken up by the carrier plate 6 and at the same time are clamped on its contact surface 5 and on its outer side 7, which likewise can be a contact surface if required. The configuration of the relevant clamp slots 81, 82 of the electrically conductive plastic body 2 is more clearly evident from the perspective view of the relevant plastic body 2 shown in FIG. 9. The plastic body 2 is formed also preferably of an electrically conductive silicon.

With its upper side the plastic body 2, which likewise contains a hole 11, that is, without an air gap, lies flush against the underside region 3 of the cover plate 4, and as in all abovementioned embodiments of the capacitive proximity and/or contact sensor according to the invention. It is also noted that here too the carrier plate 6 and the cover plate 4 are in their relative position to one another and that the contact surface 5 is facing the underside region 3 of the cover plate 4.

Figure 9:
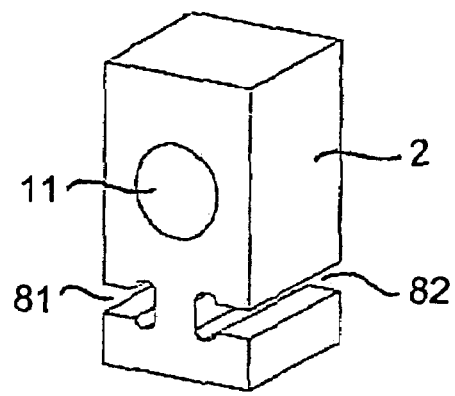
FIG. 9 is a perspective view of the plastic body contained in the capacitive proximity and/or contact sensor according to FIG. 8, configured as a clamping part.
Figure 10:
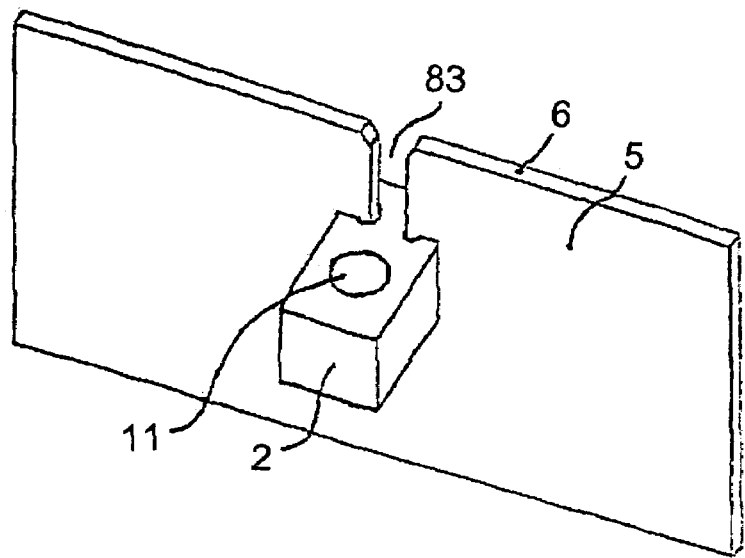
FIG. 10 is a perspective view of the plastic body shown in FIG. 9, as it is clamped on a carrier plate.

The perspective view shown in FIG. 10 clearly points out how the plastic body 2 according to FIG. 9 is received by the carrier plate 6, and in the region of a slot 83 formed in the carrier plate 6, in which the plastic body 2 is thrust and clamped in place with its clamp slots 81, 82.

At this point it should be noted that the embodiment of a capacitive proximity and/or contact sensor according to the invention ends up with an electrically conductive plastic body 2 explained by FIGS. 8 to 10, having only one clamp slot.

The functioning of the fourth embodiment of a capacitive proximity and/or contact sensor 1 according to the invention shown in FIG. 8 is the same as has been explained in connection with the capacitive proximity and/or contact sensor shown in FIG. 1.

The electrically conductive plastic bodies used in the abovementioned embodiments of the capacitive proximity and/or contact sensor according to the invention are easy to produce plastic bodies, which can be formed by stamped, injected, cast or extruded parts. To increase their elasticity the relevant plastic body, as already explained hereinabove, can be provided with at least one cavity, such as the abovementioned hole 11. Cavities can, however, also be created in other ways, for example by notches in the respective plastic body. The relevant plastic bodies in each case for bearing on an underside region of an electrically non-conductive cover plate have a surface adapted to the relevant underside region, and they are in each case designed as a plug-in and/or clamp part in their region to be connected to a contact surface of a carrier plate.

As might be evident from the above description, a capacitive proximity and/or contact sensor according to the invention can be constructed such, that the carrier plate bearing the abovementioned contact surface is disposed either parallel or perpendicular to each electrically insulating cover plate. In the process no full-surface bearing of each electrically conductive plastic body with each contact surface is constantly necessary to ensure the desired function of the capacitive proximity and/or contact sensor.

It should finally be mentioned that an adjustable tolerance equalization is possible in a relatively simple manner in installing the capacitive proximity and/or contact sensor according to the invention containing these plastic body and carrier plates as a result of the abovementioned configurations of the electrically conductive plastic bodies and their take-up by each contact surface or respectively by the carrier plate containing the latter.

It is to be noted that a form locking connection is one that connects two elements together due to the shape of the elements themselves, as opposed to a force locking connection, which locks the elements together by force external to the elements.

In contrast, a force locking connection is one that connects two elements together by force external to the elements, as opposed to a form locking connection, which is provided by the shapes of the elements themselves.

This application claims the priority, under 35 U.S.C. § 119, of German patent application No. 102 50 395.8, filed Oct. 29, 2002; the entire disclosure of the prior application is herewith incorporated by reference.

We claim:

1. A capacitive proximity or touch sensor, comprising:
    an electrically insulating cover plate having a lower-side region and a touch region opposite said lower-side region;
    a carrier plate having an electrically conducting contact area and disposed at a distance from said cover plate; and
    an electrically conductive plastic body disposed between said lower-side region of said cover plate and said contact area of said carrier plate, a position of said carrier plate being fixed in relation to said cover plate and it being possible to connect said contact area of said carrier plate to an evaluation circuit for detecting and evaluating a change in capacitance of a capacitor, said capacitor being formed by said cover plate, said plastic body and said contact area, the change in capacitance being caused by an element having a potential differing from a potential of said contact area, coming into proximity of or touching said touch region of said cover plate;
    said plastic body being a clamping part and being form lockingly connected to said carrier plate and thus to said contact area by clamping said carrier plate, said plastic body having at least one clamping slot formed therein for holding said carrier plate at said contact area.

2. The capacitive proximity or touch sensor according to claim 1, wherein said clamping slot runs in a plugging direction of said plastic body and in which said carrier plate is held in an area of said contact area.

3. The capacitive proximity or touch sensor according to claim 1, wherein said clamping part has two clamping slots formed therein for holding said carrier plate in an area of said contact area.

4. The capacitive proximity or touch sensor according to claim 1, wherein said plastic body has a cross-section selected from the group consisting of polygonal cross sections, quadrilateral cross sections, and round cross sections in a region between its abutment against said lower-side region of said cover plate and said contact area of said carrier plate.

5. The capacitive proximity or touch sensor according to claim 1, wherein said plastic body is formed as a punched, injection-molded, cast or extruded part.

6. The capacitive proximity or touch sensor according to claim 1, wherein said plastic body has at least one cavity formed therein.

7. The capacitive proximity or touch sensor according to claim 1, wherein said plastic body is composed of an electrically conductive silicon.

8. The capacitive proximity or touch sensor according to claim 1, wherein said contact area is held at ground potential.

9. A plastic body for a capacitive proximity or touch sensor having an electrically non-conducting cover plate with a lower-side region and a carrier plate with a contact area, the plastic body comprising:

a body with a surface adapted for abutting against the lower-side region of the electrically non-conducting cover plate and a clamping part to be connected to the contact area of the carrier plate.

10. The plastic body according to claim 9, wherein said body is formed of an electrically conductive silicon.

11. A plastic body for a capacitive proximity or contact sensor having an electrically non-conducting cover plate with a lower-side region and a carrier plate with a contact area, the plastic body comprising:

a body configured as a plug-in or clamp part for bearing on the lower-side region of the electrically non-conductive cover plate, said body having a surface adapted to the lower-side and in an area to be connected to the contact surface of the carrier plate.

* * * * *